(12) United States Patent
Tcherniaev et al.

(10) Patent No.: US 7,669,152 B1
(45) Date of Patent: Feb. 23, 2010

(54) THREE-DIMENSIONAL HIERARCHICAL COUPLING EXTRACTION

(75) Inventors: Andrei Tcherniaev, Mountain View, CA (US); Yuri Feinberg, Saratoga, CA (US)

(73) Assignee: Silicon Frontline Technology Inc., Campbell, CA (US)

( * ) Notice: Subject to any disclaimer, the term of this patent is extended or adjusted under 35 U.S.C. 154(b) by 115 days.

(21) Appl. No.: 11/685,630

(22) Filed: Mar. 13, 2007

(51) Int. Cl.
*G06F 17/50* (2006.01)
*G06F 9/455* (2006.01)

(52) U.S. Cl. ............................................ 716/4; 716/11
(58) Field of Classification Search .................... 716/4, 716/11
See application file for complete search history.

(56) References Cited

U.S. PATENT DOCUMENTS

| | | | |
|---|---|---|---|
| 5,452,224 | A | 9/1995 | Smith, Jr. et al. |
| 5,706,206 | A | 1/1998 | Hammer et al. |
| 5,761,080 | A | 6/1998 | DeCamp et al. |
| 5,901,063 | A | 5/1999 | Chang et al. |
| 6,128,768 | A | 10/2000 | Ho |
| 6,175,947 | B1 | 1/2001 | Ponnapalli et al. |
| 6,643,831 | B2 | 11/2003 | Chang et al. |
| 6,892,366 | B1 * | 5/2005 | Teig et al. ....................... 716/5 |
| 7,155,689 | B2 | 12/2006 | Pierrat et al. |
| 2004/0128642 | A1 * | 7/2004 | Beaudette ..................... 716/19 |
| 2005/0108669 | A1 * | 5/2005 | Shibuya .......................... 716/9 |
| 2006/0053394 | A1 * | 3/2006 | Batterywala et al. ............ 716/5 |
| 2006/0206841 | A1 * | 9/2006 | Batterywala .................... 716/5 |
| 2007/0271543 | A1 * | 11/2007 | Alpert et al. ................... 716/13 |

OTHER PUBLICATIONS

Aurenhammer, F. , "Voronoi diagrams: A survey of a fundamental geometric data structure", *ACM Comput. Survey*, 23, (1991),345-405.
Batterywala, S. H., et al., "Variance reduction in Monte Carlo capacitance extraction", *18th International Conference on VLSI Design, 2005.*, (2005),85-90.
Brambilla, A. , et al., "A statistical algorithm for 3D capacitance extraction", *IEEE Microwave and Guided Wave Letters*, [see also *IEEE Microwave and Wireless Components Letters*], 10(8), (2000),304-306.
Brambilla, A. , et al., "Measurements and extractions of parasitic capacitances in ULSI layouts", *IEEE Transactions on Electron Devices*, 50(11), (2003),2236-2247.
Brambilla, A. , et al., "Statistical method for the analysis of interconnects delay in submicrometer layouts", *IEEE Transactions on Computer-Aided Design of Integrated Circuits and Systems*, 20(8), (2001),957-966.

(Continued)

*Primary Examiner*—Jack Chiang
*Assistant Examiner*—Suresh Memula
(74) *Attorney, Agent, or Firm*—Schwegman, Lundberg & Woessner, P.A.

(57) ABSTRACT

Apparatus, systems, and methods are provided for processing integrated circuit chip design. A three-dimensional Monte Carlo random-walk process may be applied to a cell in a hierarchical description of the layout of the chip to extract information regarding the cell. The information may include coupling resistance, capacitance, inductance, or combinations thereof. A neighborhood of the cell may be built and data correlated to the neighborhood may be stored. Such a technique may be applied from a bottom level to a top level of the hierarchical description of the chip layout.

30 Claims, 5 Drawing Sheets

OTHER PUBLICATIONS

Garg, A., et al., "Accurate high-speed performance prediction for full differential current-mode logic: the effect of dielectric anisotropy", *IEEE Transactions on Computer-Aided Design of Integrated Circuits and Systems*, 18(2), (1999),212-219.

Iverson, Ralph B., et al., "A floating random-walk algorithm for extracting electrical capacitance", *Mathematics and Computers in Simulation*, 55(1-3), (2001),59-66.

Jere, J. N., et al., "An improved floating-random-walk algorithm for solving the multi-dielectric Dirichlet problem", *IEEE Transactions on Microwave Theory and Techniques*, 41(2), (1993),325-329.

Le Coz, Y. L., et al., "A stochastic algorithm for high speed capacitance extraction in integrated circuits", *Solid-State Electronics*, 35(7), (1992),1005-1012.

Le Coz, Y. L., et al., "Performance of random-walk capacitance extractors for IC interconnects: a numerical study", *Solid-State Electronics*, 42(4), (1998),581-588.

Maffezzoni, P., et al., "A statistical approach to derive an electrical port model of capacitively coupled interconnects", *IEEE Transactions on Circuits and Systems I: Regular Papers, [see also Circuits and Systems I: Fundamental Theory and Applications, IEEE Transactions on]*, 51(4), (2004),797-807.

Maffezzoni, P., et al., "Analysis of substrate coupling by means of a stochastic method", *IEEE Electron Device Letters*, 23(6), (2002),351-353.

Maffezzoni, P., et al., "Study of statistical approaches to the solution of linear discrete and integral problems", *IEEE Transactions on Circuits and Systems I: Fundamental Theory and Applications, [see also Circuits and Systems I: Regular Papers, IEEE Transactions on]*, 50(9), (2003), 1153-1161.

Papadopoulou, E., "Critical area computation for missing material defects in ULSI circuits", *IEEE Transactions on Computer-Aided Design of Integrated Circuits and Systems*, 20(5), (2001),583-597.

Papadopoulou, E., et al., "The L∞ Voronoi Diagram of Segments and VLSI Applications", *International Journal of Computational Geometry & Applications*, 11(5), (2001),503-528.

Prabhakaran, M. M., "Deterministic and Randomized Methods for Capacitance Estimation", *BTech Project Report, Indian Institute of Technology, Bombay*, (2000), 1-34.

Royer, G. M., "Monte Carlo Procedure for Theory Problems Potential", *IEEE Transactions on Microwave Theory and Techniques*, 19(10), 1971),813-818.

Sadiku, Matthew N., "Monte Carlo solution of axisymmetric potential problems", *IEEE Transactions on Industry Applications*, 29(6), (1993),1042-1046.

Sadiku, M., et al., "Solution of Dirichlet problems by the Exodus method", *IEEE Transactions on Microwave Theory and Techniques*, 40(1), (1992),89-95.

Schlott, R., "A Monte Carlo method for the Dirichlet problem of dielectric wedges", *IEEE Transactions on Microwave Theory and Techniques*, 36(4), (1998),724-730.

\* cited by examiner

US 7,669,152 B1

THREE-DIMENSIONAL HIERARCHICAL COUPLING EXTRACTION

FIELD

Embodiments of the inventive subject matter relate generally to integrated circuits and chip design.

BACKGROUND

Modern integrated circuit chips are designed in hierarchical fashion, which means that small design pieces are reused to form larger pieces which, in term, are also reused. One of the representations of the chip used in the process of the design is a so-called layout. Layout of the chip includes several two-dimensional representations of each layer of the chip, which is a collection of geometrical shapes that may be stored in some form on a computer. Typically, these geometrical shapes represent some objects on the chip, for example, metal wires, while the space between the layers is filled with non-conducting material (dielectric). To reproduce the complete three dimensional picture of the chip design, additional information about layer thickness and distance between the layers is needed, such information is often called technology information.

Modern chips typically contain millions of active devices, such as transistors, connected by interconnect wires. While a few years ago, the resistance and capacitance, associated with such wires could be neglected, this may no longer be true. In designs at 130 nm and below, interconnect delays determine system performance. Decreasing conductor widths may lead to increased interconnect resistance, while decreasing conductor spacing may cause increased interconnect capacitance. Three-dimensional effects such as fringing and interline coupling are dominant as conductors become taller relative to their width. As a result, parasitic resistance, inductance, and capacitance (RLC) extraction have become a well-established step in the semiconductor chip design and verification process. Since interconnect resistance and capacitance cannot be accounted for during the design stage, accurate calculation of these parameters based on actual chip layout is indispensable for correct chip performance.

Traditionally, extractors of parasitic interconnect RLC values fall into two distinct categories: relatively accurate small-capacity technology computer aided design (TCAD) tools and library-based full-chip pattern matching platforms. TCAD tools typically deal with a small number of three-dimensional (3D) objects and employ numerically-intensive mesh-based (finite element or boundary element) algorithms. Since computational complexity increases super-linearly with the number of elements simulated, no more than several thousands of elements can be handled resulting in accuracy of about few percent for configurations with no more than tens of 3D objects. In the past decade, a number of powerful accelerating techniques, such as a fast multipole method, have been successfully applied to tackle extraction of well-separated conductors and gained popularity for fringe market of printed circuit board (PCB) and packaging designs. Still, these traditional mesh-based approaches have inherent strict capacity limitations for densely-packed IC designs.

In the past decade, the electronic design automation (EDA) industry witnessed the recognition of a different class of TCAD tools based on stochastic methods. Instead of partitioning space or conductor boundaries to large number of elements, capacitance is evaluated by performing multiple random walks of a single "particle" in the dielectric space between the conductors. Because of spatial locality of such walks, even a large number of 3D objects can be handled with a small memory "footprint." Further, capacitance of large and complex net can be accurately determined using limited number of walks.

Due to inherent capacity and performance limitations, accurate RC extraction methods are impractical or impossible to deal with large full-chip designs. On other hand, importance of post-layout effects demands verification of large industrial size chip. This practical need brought about a class of extraction tools that are based on pattern matching and currently dominate the parasitic extraction market. In such tools, only a fraction of a net is handled in the presence of a few selected adjacent segments. Basically, the complex IC layout is cut and approximately matched to a library of hundreds of pre-solved configurations. In addition shielding and third-body effects are either ignored or treated approximately. Despite huge computational efforts, the pre-built pattern library cannot cover all possible mutual positions of multiple and complex 3D conductors in presence of multilayered dielectrics.

Use of pattern-matching based tools typically does not provide an estimation of the accuracy of obtained results. In addition, such tools depend on a number of "tricks" and other empirical data to ameliorate their poor accuracy. This leads to the use of TCAD tools for result verification, especially for critical nets. Such manual selection and verification process is extremely tedious and is quite far from a "push-button" solution.

With the astonishing pace of semiconductor manufacturing, traditional verification methods, suitable for handling small number of devices, often become un-scalable to handle hundreds of millions of transistors in modern designs. A brute-force approach, based on increased processing speed and proliferation of 64-bit memory platforms, may succeed only for weakly coupled blocks. However, in areas such as dynamic transistor-level simulation or RC extraction, where coupling between objects is strong, the only possible solution to tackle huge designs seemed to be model simplification and reduced accuracy. Recent hierarchical processing has revolutionized these seemingly stagnant market segments providing orders of magnitude performance improvements without sacrifice in accuracy.

Historically, the design of increasingly large IC chips is based on creation of small blocks and combining them together in a hierarchical fashion. Design output formats, from SPICE (Simulation Program with Integrated Circuit Emphasis) netlists to GDSII (Gerber Data Stream Information Interchange) layouts reflect a natural hierarchical structure of design. However, usage of hierarchy in EDA tools is frequently based on repeating results of individual blocks ignoring essential effects of interaction between them. Since results of flattened (slow but accurate) calculations significantly differ from advertised fast hierarchical mode, users have typically abandoned the latter as unreliable.

Failure to appropriately evaluate interconnect effects frequently leads to design respins due to functional and timing violations as well as electromigration degradation.

BRIEF DESCRIPTION OF THE FIGURES

Embodiments of the invention are illustrated by way of example and not limitation in the figures of the accompanying drawings in which.

DESCRIPTION

Various embodiments of the invention are described by way of example and not limitation in the following descriptions. In various embodiments, systems, apparatus, and procedures provide a synergy of stochastic methods for parasitic extraction and hierarchical processing capabilities. Such a synergy empowers an implementation of a usage of hierarchy for strongly-coupled systems based on a rigorous mathematical treatment. Such procedures allow for substantially solving the problem of exact capacitance extraction in presence of spatial boundaries. Stochastic methods for parasitic extraction may be applied to the hierarchy of the chip layout. Such procedures do not predominantly rely on pre-computed pattern matching, but rather address solutions to the original layout configuration.

Figure 1:
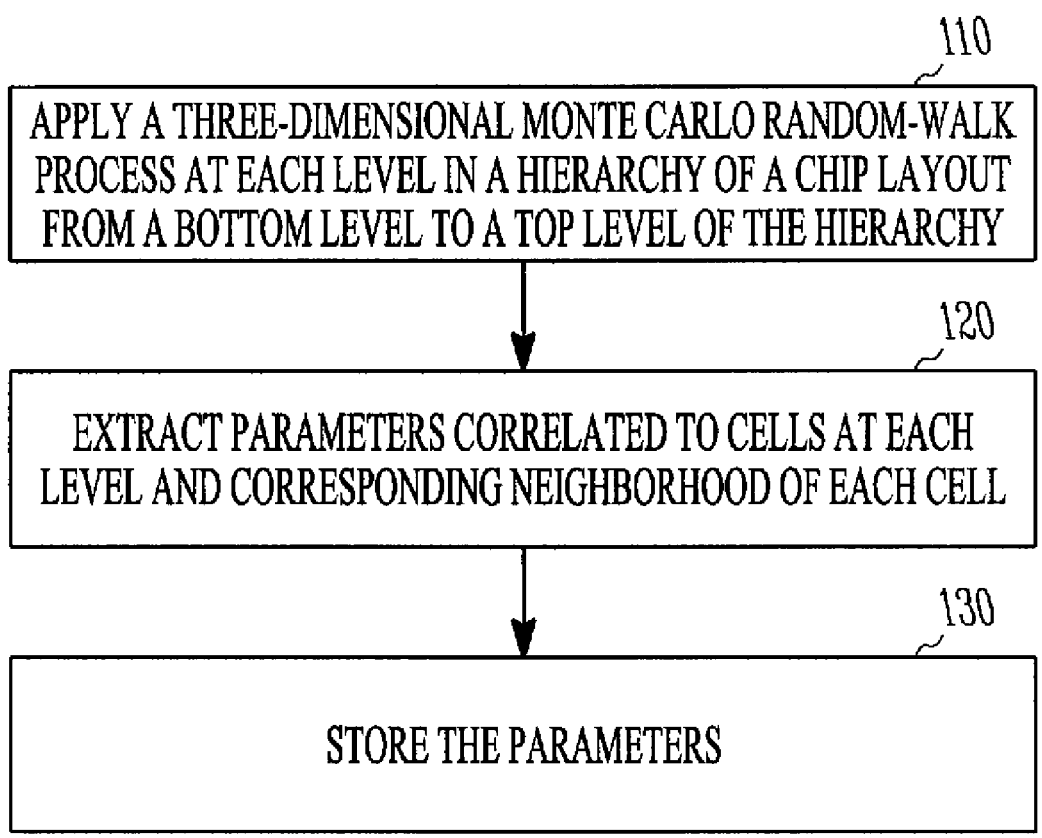
FIG. 1 illustrates a flow diagram of features of an embodiment of a method for extracting parameters for chip design.

FIG. 1 illustrates a flow diagram of features of an embodiment of a method for extracting parameters for chip design. At 110, a three-dimensional Monte Carlo random-walk process is applied at each level in a hierarchy of a chip layout from a bottom level to a top level of the hierarchy. At 120, parameters, which are correlated to cells at each level and the neighborhood corresponding to each cell, are extracted. In addition, the neighborhood for each cell is determined, where the neighborhood includes any conductor that significantly contributes to the extracted parameters for the cell. The parameters may include coupling resistances, coupling capacitances, coupling inductances, or combinations thereof. At 130, the parameters are stored. Information on the entities in the neighborhood of each cell may be stored. The stored data corresponding to a processed cell may be applied to other cells having environments substantially matching that of the processed cell without applying a three-dimensional Monte Carlo random-walk process to these other cells. The three-dimensional Monte Carlo random-walk process and parameter extraction at the various levels may be iteratively repeated to meet a specified accuracy level.

Figure 2:
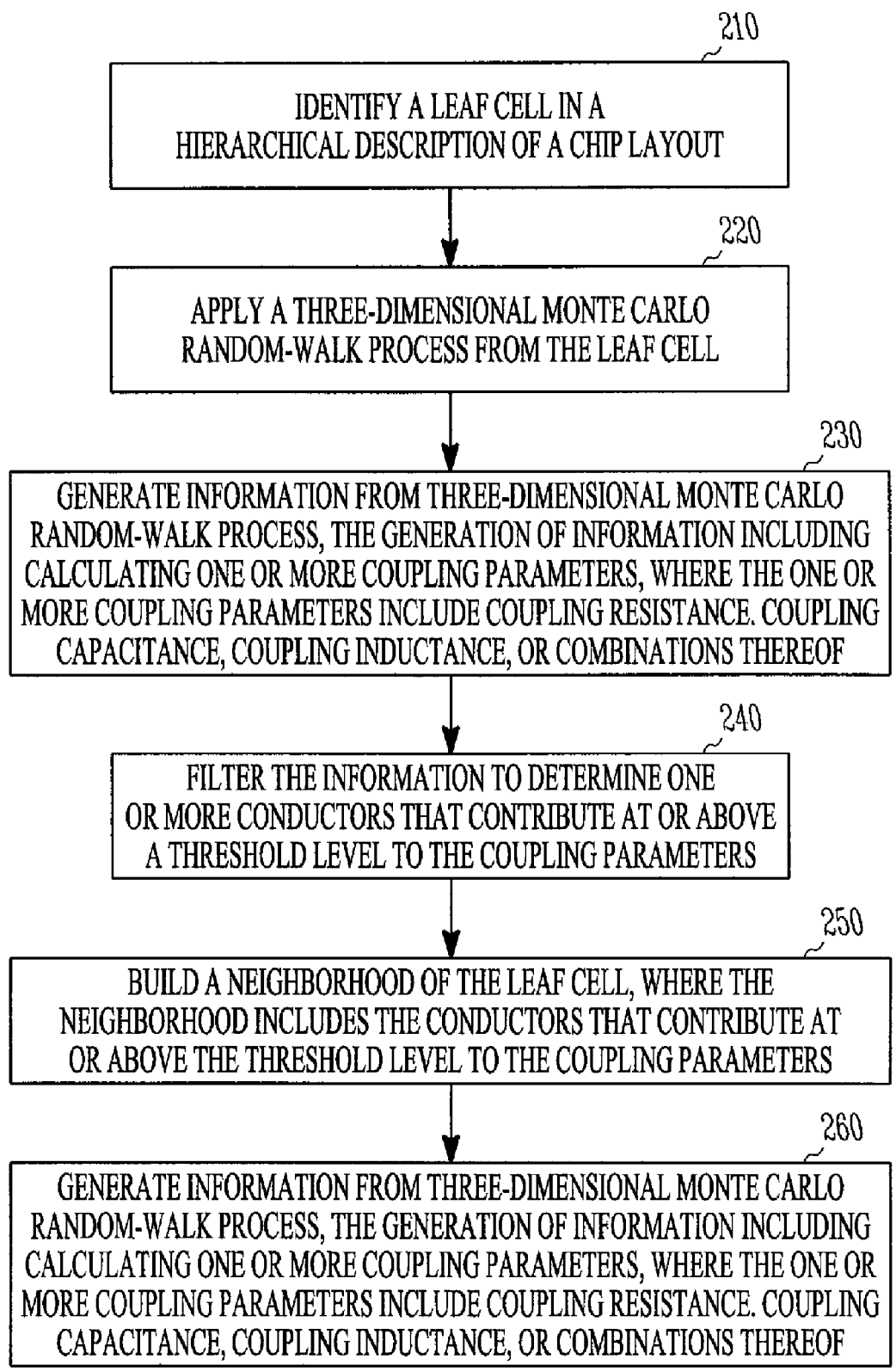
FIG. 2 illustrates a flow diagram of features of an embodiment of a method for extracting resistance, capacitance, and/or inductance for chip design.

FIG. 2 illustrates a flow diagram of features of an embodiment of a method for extracting resistance, capacitance, and/or inductance for chip design. At 210, a leaf cell in a hierarchical description of a chip layout is identified. A leaf cell is an elementary unit in the design. A layout description for the chip may be provided in various forms. In an embodiment, a GDSII format or variation thereof may be used. GDSII is a database format for IC data exchange, which has become a de facto standard. Such a format provides a representation of planar geometric shapes and other information in a hierarchical form in which objects may be group by attributes. Other formats may be used to provide the description of the chip layout. The information in appropriate format may be read into a system used to execute an embodiment for extracting resistance, capacitance, and/or inductance for chip design. The information may be entered by accessing a data storage system to retrieve the hierarchical description of the chip layout. The data storage system may be realized by any form of memory that may provide data for use by a controller to extract coupling parameters in an IC design. Additional information may be read in or accessed. Such information may include a description of the thickness of each layer of the chip and distances between the layers along with a description of dielectric constants for non-conducting layers. In an embodiment, inputs to an extraction procedure may include a specified accuracy and/or nets to be extracted. A net is a piece of a conducting material. A net may be a single electrical path in a circuit that has the same value at all of its points. A net may represent a signal path in the circuit. Input files to the extraction procedure may include a design layout file, a technology file providing vertical cross-section with conductor and dielectric layers identified, a rule file describing primary and derived layers, a text attachment, and device definition, a map file establishing correspondence between conducting layers in the technology file and derived layers from the rule file, and optional schematics for a layout versus schematic (LVS) comparison. An input file may be provided in a number of formats, for example, GDSII binaries may be used to provide a design layout.

Figure 3:
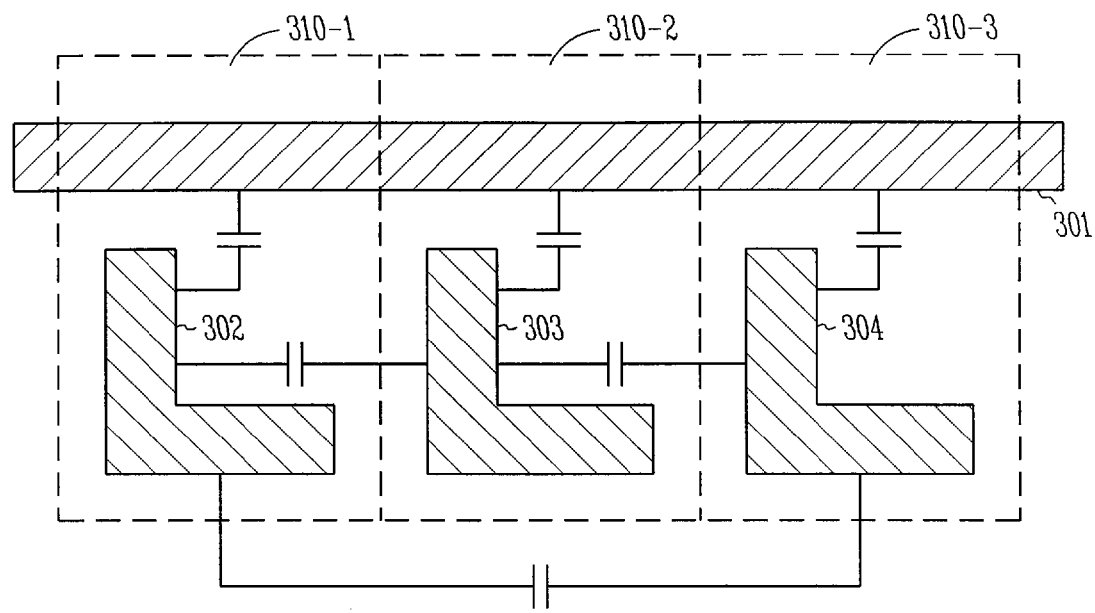
FIG. 3 illustrates a simple top view of an embodiment of a fragment of an example chip layout.

The acquired information may be used to construct an internal three-dimensional representation of the chip layout design, while preserving the hierarchy. The constructed chip design may be traversed to a level for the leaf cell to initiate the extraction process from the leaf cell. A leaf cell contains a set of conducting nets or polygons. FIG. 3 illustrates a simple top view of an embodiment of a fragment of an example chip layout in hierarchical form. For simplicity, a single layer of the chip is shown. There are four nets 301-304, separated by dielectrics. Dashed lines shows the boundaries of three instances of leaf cells 310-1, 310-2, and 310-3. In the example shown, leaf cells 310-1, 310-2, and 310-3 are instances of the same cell, repeated three times. Each leaf cell 310-1, 310-2, 310-3 contains internal (L-shaped polygon for example) net 302, 303, 304, respectively, and a fragment of large net 301. Large net 301 belongs to a cell on the higher level of cell hierarchy, but its fragments belong to the individual leaf cells.

Figure 4:
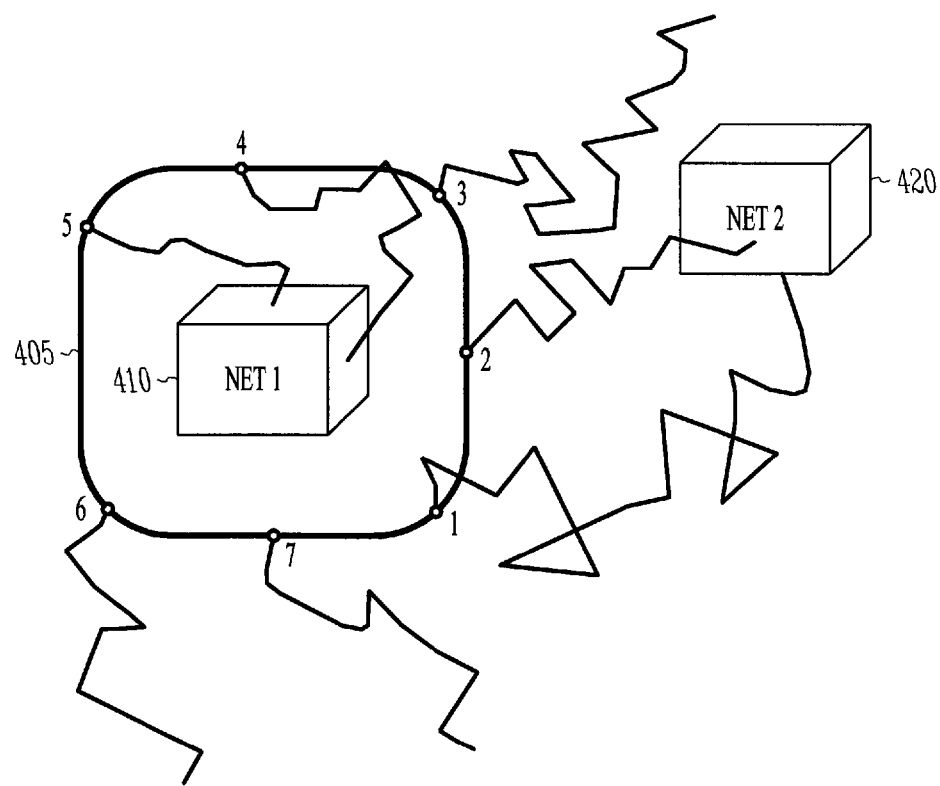
FIG. 4 illustrates an embodiment of a random-walk procedure in which a random walk starts from a Gauss surface surrounding one net and continues until the random walk hits another net.

At 220 of FIG. 2, a three-dimensional Monte Carlo random-walk process from the leaf cell is applied. The random-walk process may be realized as a random-walk in three dimensions that is not limited to a planar representation of a layer of the design or to a mesh. The Monte Carlo random-walk procedure may be started from the leaf level by dispatching a certain number of random-walks from each conductor Gauss surface on the leaf level or within such conductor. Multiple random-walk procedures from points randomly selected on a Gauss surface may be initiated. A Gauss surface, or Gaussian surface is a surface over which the normal component of electric field resulting from a given charge distribution is constant. The outward flux of an electric field over the closed surface is proportional to the total charge enclosed in the surface. In an embodiment, a Gauss surface is constructed by enclosing a surface for each net of the leaf cell. FIG. 4 illustrates an embodiment of a random-walk procedure in which a random walk starts from a Gauss surface 405 surrounding one net 410 and continues until the random walk hits another net 420. Multiple walks are initiated from a number of random points, such as points 1-7, on Gauss surface 405. Accuracy of the process may be correlated to the number of random walks initiated from Gauss surface 405. A random-walk procedure may include repetitive selection of a maximum cube 410 not including any of the conducting nets surrounding each point on the Gaussian surface 405 and selecting a random point on the surface of cube 410 from where the procedure is repeated until the next selected point hits the surface of conducting net 420. Conducting net 420 may or may not belong to the leaf cell from where the random-walk was started.

Figure 5:
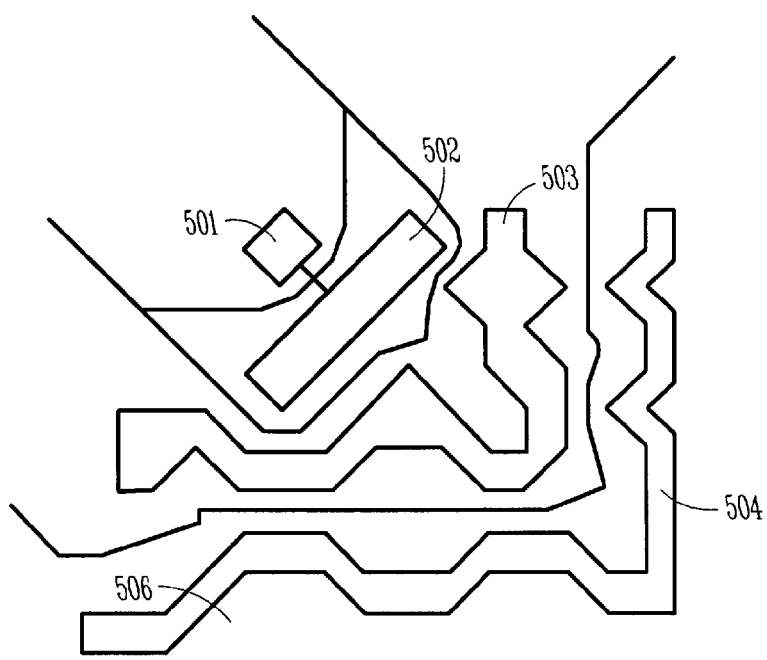
FIG. 5 illustrates an embodiment in which a Voronoi diagram is used to construct the Gauss surfaces for a variety of nets.

FIG. 5 illustrates an embodiment in which a Voronoi diagram is used to construct the Gauss surfaces for a variety of nets 501, 502, 503, and 504 by division of the space between these nets in each layer. A Voronoi diagram partitions a plane of n points into convex polygons such that each polygon contains exactly one generating point and every point in a given polygon is closer to its generating point than to any other. Chip layer 506 provides the plane in which nets 501, 502, 503, and 504 are effectively points in chip layer 506. Construction of Voronoi diagrams for each layer to determine the Gauss surface for each net may enhance the speed and accuracy of calculations to extract the desired parameters. Techniques other than generating Voronoi diagrams may be used to construct the Gauss surfaces.

At 230 of FIG. 2, information from the three-dimensional Monte Carlo random-walk process is generated. In an embodiment, information collected is related to the random-walks termination points. The generation of information includes calculating one or more coupling parameters. The one or more coupling parameters may include coupling resistance, coupling capacitance, coupling inductance, or combinations thereof. After a certain number of random-walks are performed, information about the coupling values with the surrounding nets may be accumulated.

At 240 of FIG. 2, the information is filtered to determine one or more conductors that contribute to the coupling at or above a threshold level to the coupling parameters. Filtering with respect to a threshold level allows the extraction process to consider conductors with significant contribution of coupling capacitance, resistance, or inductance relative to the leaf cell being analyzed. By neglecting the nets with insignificant coupling values, the process allows for determination of the neighboring cells with important coupling contribution to the current cell.

At 250 of FIG. 2, a neighborhood of the leaf cell is built, where the neighborhood includes the conductors that contribute at or above the threshold level to the coupling parameters. A neighborhood includes a collection of geometrical information such as, but not limited to, distances between objects and their shapes. By building and storing neighborhoods of the current leaf level cell relative to a threshold level, such neighborhoods include other leaf cells with significant coupling with the starting leaf cell. The random-walk process generates capacitances and neighborhoods without confinement to a pre-deterministic pattern.

Figure 6:
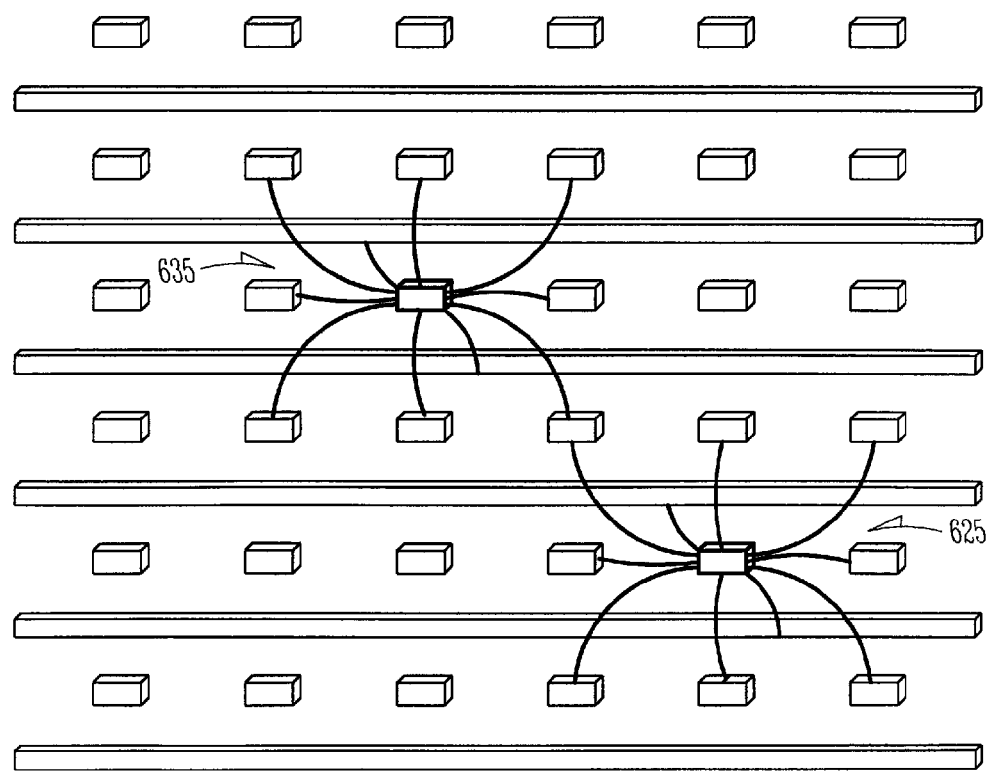
FIG. 6 illustrates an embodiment that finds a significant neighborhood in the hierarchical design.

At 260 of FIG. 2, data corresponding to the neighborhood of the leaf cell is stored. FIG. 6 illustrates an embodiment which finds a significant neighborhood in the hierarchical design. As shown, neighborhoods 625 and 635 are identical, in which case calculations for parameter extraction may be performed just once. The result of parameter calculations for one neighborhood may be attributed to both neighborhoods. Correlation of these parameters may be realized by storing the same values for both neighborhoods in an appropriate storage medium. The coupling parameters and related physical and geometrical information of the current leaf cell, including neighborhood information, is stored, which in essence memorizes the configuration of the current leaf cell. Related physical and geometrical information may include distances to conductors that contribute at or above a threshold level to the coupling parameters and/or the geometry of conductors that contribute at or above a threshold level to the coupling parameters. The memorized or stored information may be reused each time an identical configuration of the cells is found, thus excluding redundant calculations. Such a process is performed hierarchically until the complete design is processed. A leaf cell may include only portions of complete nets, so the extracted RLC parameters may be partial values. In the case of extracted partial values, such partial couplings may be added on the next higher hierarchy level to determine complete net couplings.

The process is continued until all leaf cells are processed. If a current leaf cell belongs to a neighborhood having an environment substantially the same as an already processed leaf cell, the relevant information of the current leaf cell may be stored or indexed without repeating random-walk calculations. If the information is not stored directly for the similar leaf cell, it may be indexed back to the previously processed leaf cell using a pointer mechanism. The hierarchy may be traversed from leaf cells to a top level such that coupling capacitance, resistance, or inductance values may be assembled from each level from the of leaf cell level to the top level of the hierarchy. The extracted coupling capacitance, resistance, or inductance values may be output in a variety of formats. The outputs may include providing a digital file, providing a printout, providing a visual display of the information, or other format for conveying the information.

In an embodiment, a level of accuracy may be set with respect to the extraction of coupling parameters. The coupling parameters may include, but are not limited to, coupling capacitance, resistance or inductance. Setting a level of accuracy may be used to evaluate whether or not the values of the extracted coupling are adequate or inadequate for the given application. A threshold level may be set such that, if it is determined that the accuracy of the extracted parameters is below the given threshold level, the traversal of the layout hierarchy with the associated performance of the Monte-Carlo random-walk procedure for nets may be repeated. The values of the newly generated coupling parameters may again be compared to the threshold level for accuracy and the process repeated based on the comparison. Stochastic extraction methods closely correlate to exact analytical solutions and silicon measurements. Such methods may deliver capacitance values that are within one percent of silicon measurements. In an embodiment, an extractor implementing a 3D random walk approach may be configured to provide a specified, or dial-in, accuracy and error-bounds reporting on each net, which may allow operator control at a desired level of accuracy of the results.

Various embodiments or combinations of embodiments for apparatus and methods for IC chip design using a procedure for extracting resistance, capacitance, and/or inductance, as described herein, can be realized in various combinations of hardware and software implementations. These implementations may include a machine-readable medium having machine-executable instructions for performing an embodiment of an extraction process. The machine-readable medium may include machine-executable instructions such that, when executed by a machine, cause the machine to identify a leaf cell in a hierarchical description of a chip layout, to apply a three-dimensional Monte Carlo random-walk process from the leaf cell, to generate information from the three-dimensional Monte Carlo random-walk process, where the generation of information includes the calculation or one or more coupling parameters, which may include coupling resistance, coupling capacitance, coupling inductance, or combinations thereof, to filter the information to determine the conductors that contribute at or above a threshold level to the coupling parameters, to build a neighborhood of the leaf cell, where the neighborhood includes the conductors that contribute at or above the threshold level to the coupling parameters, and to store data corresponding to the neighborhood of the leaf cell. The machine may be a computer. The machine may be a system dedicated to IC design. The machine may be any machine arranged to operate to conduct an embodiment of a parameter extraction process for IC design. The machine-readable medium may be an instrumentality to store data such as, but not limited to, semiconductor memory, magnetic memory, or other data storage devices. The machine-readable medium used may depend on the application using an embodiment of a parameter extraction procedure for IC design.

The machine-readable medium may include instructions to build a neighborhood of the leaf cell including considering other leaf cells having a threshold coupling to the leaf cell. The machine-readable medium may include instructions to store data corresponding to the neighborhood of the leaf cell. Such data may include coupling resistance, coupling capacitance, coupling inductance, or combinations thereof for the leaf cell and/or distances to conductors that contribute at or above the threshold level to the coupling parameters. The instructions may include instructions to determine the geometry of the conductors that contribute at or above the threshold level to the coupling parameters. The instructions may include instructions to access the hierarchical description of the chip layout, to access a description of chip layers, where the description includes a thickness of each chip layer and distances between the chip layers, and/or to access a description of dielectric constants for chip layers that are non-conducting. The instructions may include instructions to identify another leaf cell having an environment matching the built neighborhood, to apply the stored data corresponding to the built neighborhood to generate a neighborhood for the other leaf cell, and/or to store information of the generated neighborhood of the other leaf cell. The instructions may include instructions to traverse from a leaf cell level to a top level of the hierarchical description of the chip layout, to perform a three-dimensional Monte Carlo random-walk process, coupling parameter calculation, and neighborhood build at each level traversed, and to output extracted coupling parameters. The extracted coupling parameters may include one more of coupling resistance, coupling capacitance, coupling inductance, or combinations thereof at each level traversed. The instructions may include instructions to repeat the three-dimensional Monte Carlo random-walk process from the leaf cell, the generated of information, the filtering of the information, the building of the neighborhood, and the storing of data, if a value for a coupling parameter does not meet an accuracy threshold level.

Figure 7:
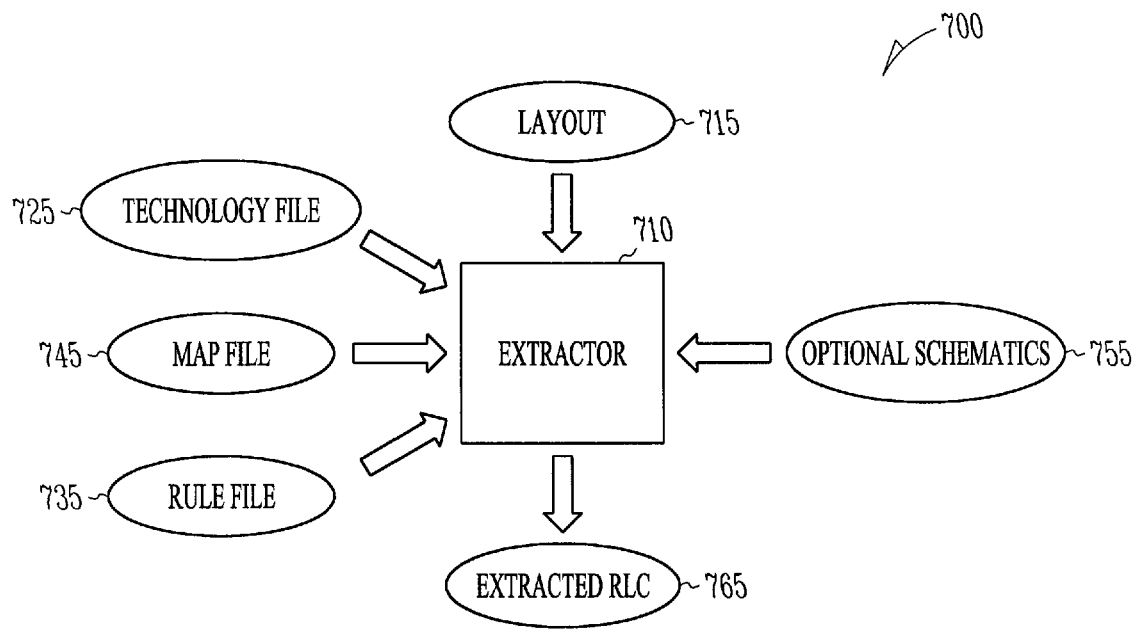
FIG. 7 depicts features of an embodiment of an apparatus having an extractor.

FIG. 7 depicts features of an embodiment of an apparatus 700 having an extractor 710. Extractor 710 may be operated with a user supplied configuration file specifying desired accuracy and optionally specifying nets to be extracted. Apparatus 700 may include instrumentality to provide inputs to extractor 710. Such input may include a design layout 715, a technology file 725, a rule file 735, a map file 745, and optional schematics 755. These input files may be provided in a number of appropriate formats. For example, design layout 715 may include GDSII binaries. Technology file 725 may be structured to provide information of physical layers including vertical cross-sections of the chip design with conductors and dielectric layers identified. Rule file 735 may be structured to describe logical layers including primary and derived layers of the design, a text attachment, and device definition. Map file 745 may be structured to establish correspondence between conducting layers in technology file 725 and derived layers from rule file 735. Optional schematics 755 may be structured for a LVS comparison. Apparatus 700 functioning as a design tool may include output 765 that outputs a netlist containing extracted resistances and capacitances, in addition to pre-layout devices. The extracted resistances and capacitances may be generated in various formats including, but not limited to, SPICE and/or DSPF (detailed standard parasitic format) formats.

Figure 8:
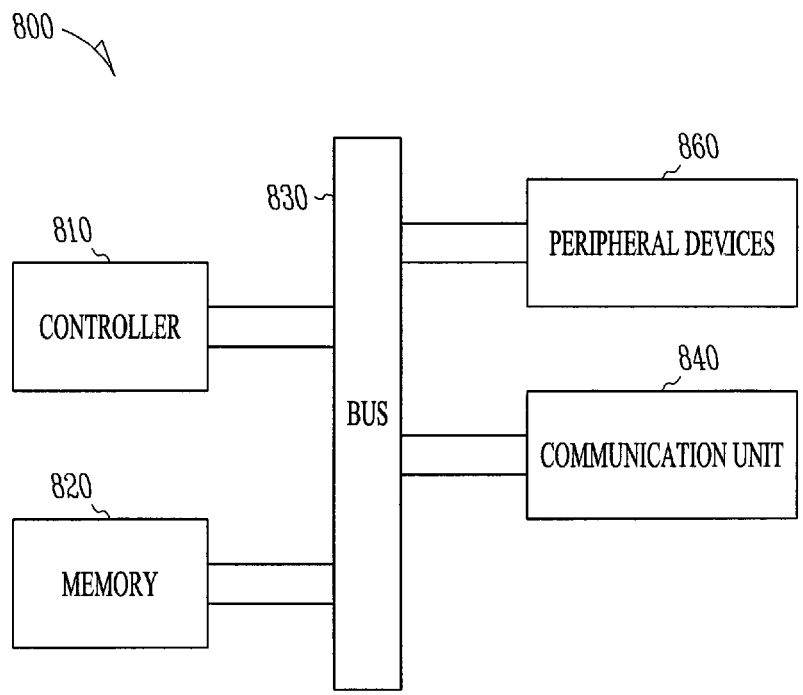
FIG. 8 illustrates a block diagram of an embodiment of a system that includes a platform for IC chip design using a procedure for extracting parameters, according to the teachings described herein.

FIG. 8 illustrates a block diagram of an embodiment of a system 800 that includes a platform for IC chip design using a procedure for extracting parameters, as described herein. System 800 includes a controller 810, a memory 820, and a bus 830, where bus 830 provides electrical connectivity between controller 810 and memory 820. In an embodiment, controller 810 is a processor. An apparatus configured in a manner as apparatus 700 of FIG. 7 may be embedded in system 800. The components of such an embedded apparatus may be distributed in function and structure in controller 810, memory 820, and/or other components of system 800. Memory 820 may include any form of machine-readable medium that has machine executable instructions to extract coupling parameters, such as, but not limited to, resistance, capacitance, and/or inductance, for IC design and/or verification according to the teachings discussed herein.

In an embodiment, system 800 may include an additional peripheral device or devices 860 coupled to bus 830. Peripheral devices 860 may also include displays, additional storage memory, or other control devices that may operate in conjunction with controller 810 and/or memory 820. The display may include a variety of formats in which information, which is correlated to the IC design under consideration, may be conveyed such as, but not limited to, a print medium or video medium.

System 800 may include a communication unit 840 coupled to controller 810 via bus 830. In an embodiment, communication unit 840 may include a network interface to transmit data regarding the IC design to systems external to system 800.

In various embodiments, an extraction method includes constructing an enclosing surface for each net of a leaf cell and conducting multiple random-walk procedures from points randomly selected on the enclosing surface. In various embodiments, methods and apparatus are provided to calculate interconnect wire capacitances of an integrated circuit. The apparatus may employ a number of instrumentalities to obtain a layout representation describing integrated circuit design, to convert the description into an internal hierarchical geometrical representation, to obtain technology information about the positions of dielectrics layers within the design, to traverse the internal representation of the design to a leaf level, and to apply a random-walk calculation methodology to the leaf components. The design hierarchy provides an instrument to avoid redundant calculations, which allows the processing of much larger designs than a conventional method can handle. An embodiment for extracting coupling handles the chip design hierarchy, without flattening the chip design. Use of hierarchy with Monte Carlo extraction approaches enables enhanced full-chip verification.

In an embodiment, an extractor provides a 3D random walk extraction engine, efficient handling of 3D and complex technology effects, selectable dial-in accuracy, built-in accuracy estimation and reduction, incremental extraction, specifiable runtime, a runtime per net that is independent of net size and complexity, and compatibility with conventional hierarchical verification tools. In various embodiments, apparatus and systems include efficient RC extraction tools that combine user-set accuracy and performance enhancement due to use of hierarchy. Such apparatus and systems present significant enhancements to such design styles as hierarchical memories, accuracy sensitive analog and mixed-signal designs, and high-end digital processors.

In the above detailed description, reference may be made to specific examples by way of drawings and illustrations. It is to be understood that the above description is intended to be illustrative, and not restrictive, and that the phraseology or terminology employed herein is for the purpose of description. These examples are described in sufficient detail to enable those skilled in the art to practice embodiments of the inventive subject matter and serve to illustrate a manner in which the inventive subject matter may be applied to various purposes or embodiments. Other embodiments may be included within the inventive subject matter, as logical, mechanical, electrical, and other changes may be made to the example embodiments described herein. The various embodiments are not necessarily mutually exclusive, as some embodiments may be combined with one or more other embodiments to form new embodiments. Features or limitations of various embodiments described herein do not limit the inventive subject matter as a whole, and any reference to the invention, its elements, operation, and application are not limiting as a whole, but serve only to define these example embodiments. The above detailed description does not, therefore, limit embodiments of the invention.

What is claimed is:

1. A method for semiconductor chip design comprising:
   identifying a leaf cell in a hierarchical description of a chip layout;
   applying a three-dimensional Monte Carlo random-walk process from the leaf cell;
   generating information from the three-dimensional Monte Carlo random-walk process, the generation of information including calculating one or more coupling parameters, the one or more coupling parameters including coupling resistance, coupling capacitance, coupling inductance, or combinations thereof;
   filtering the information to determine one or more conductors that contribute at or above a threshold level to the coupling parameters and neglecting conductors that contribute below the threshold level to the coupling parameters, the threshold level being a numeric threshold level;
   building a neighborhood of the leaf cell, the neighborhood including the conductors that contribute at or above the threshold level to the coupling parameters and neglecting the conductors that contribute below the threshold level to the coupling parameters; and
   storing data corresponding to the neighborhood of the leaf cell on a computer-readable medium.

2. The method of claim 1, wherein building a neighborhood of the leaf cell includes building the neighborhood including other leaf cells having a threshold coupling to the leaf cell.

3. The method of claim 1, wherein storing data corresponding to the neighborhood of the leaf cell includes storing the coupling resistance, coupling capacitance, coupling inductance, or combinations thereof for the leaf cell.

4. The method of claim 1, wherein storing data corresponding to the neighborhood of the leaf cell includes storing distances to the one or more conductors that contribute at or above the threshold level to the coupling parameters.

5. The method of claim 1, wherein building a neighborhood of the leaf cell includes determining a geometry of the conductors that contribute at or above the threshold level to the coupling parameters.

6. The method of claim 1, wherein applying a three-dimensional Monte Carlo random-walk process from the leaf cell includes generating a plurality of random-walks from each conductor Gauss surface on the leaf level or within each conductor.

7. The method of claim 1, wherein the method includes:
   inputting the hierarchical description of the chip layout;
   inputting a description of chip layers, the description including a thickness of each chip layer and distances between the chip layers; and
   inputting a description of dielectric constants for chip layers that are non-conducting.

8. The method of claim 1, wherein the method includes:
   identifying another leaf cell having an environment matching the built neighborhood, the other leaf cell being in the hierarchical description of the chip layout;
   applying the stored data corresponding to the built neighborhood to generate a neighborhood for the other leaf cell; and
   storing information of the generated neighborhood of the other leaf cell.

9. The method of claim 1, wherein the method includes
   identifying another leaf cell being in the hierarchical description of the chip layout, the other leaf cell having an environment that does not match the built neighborhood;
   applying another three-dimensional Monte Carlo random-walk process from the other leaf cell;
   generating other information from the three-dimensional Monte Carlo random-walk process from the other leaf cell, the generation of other information including calculating one or more coupling parameters to the other leaf cell, the one or more coupling parameters including coupling resistance, coupling capacitance, coupling inductance, or combinations thereof;
   filtering the other information to determine one or more conductors that contribute at or above the threshold level to the coupling parameters to the other leaf cell;
   building a neighborhood of the other leaf cell, the neighborhood of the other leaf cell including the conductors that contribute at or above the threshold level to the coupling parameters to the other leaf cell; and
   storing other data corresponding to the neighborhood of the other leaf cell.

10. The method of claim 1, wherein the method includes:
    traversing from a leaf cell level to a top level of the hierarchical description of the chip layout;
    performing a three-dimensional Monte Carlo random-walk process, coupling parameter calculation, and neighborhood build at each level traversed; and
    outputting extracted coupling parameters, the extracted coupling parameters including one more of coupling resistance, coupling capacitance, coupling inductance, or combinations thereof at each level traversed.

11. The method of claim 1, wherein the method includes constructing Voronoi diagrams at each chip layer in the hierarchical description of the chip layout to determine a Gauss surface for each of a plurality of leaf cells on each chip layer.

12. The method of claim 1, wherein the method includes repeating the three-dimensional Monte Carlo random-walk process from the leaf cell, the generation of information, the filtering of the information, and the building of the neighborhood, if a value for a coupling parameter does not meet an accuracy threshold level.

13. A machine-readable medium having machine-executable instructions that, when performed by a machine, cause the machine to:
    identify a leaf cell in a hierarchical description of a chip layout;
    apply a three-dimensional Monte Carlo random-walk process from the leaf cell;
    generate information from the three-dimensional Monte Carlo random-walk process, the generation of information including the calculation or one or more coupling parameters, the one or more coupling parameters including coupling resistance, coupling capacitance, coupling inductance, or combinations thereof;
    filter the information to determine one or more conductors that contribute at or above a threshold level to the coupling parameters and neglect conductors that contribute below the threshold level to the coupling parameters, the threshold level being a numeric threshold level;
    build a neighborhood of the leaf cell, the neighborhood including the conductors that contribute at or above the threshold level to the coupling parameters and neglecting the conductors that contribute below the threshold level to the coupling parameters; and
    store data corresponding to the neighborhood of the leaf cell.

14. The machine-readable medium of claim 13, wherein instructions to build a neighborhood of the leaf cell include building the neighborhood including other leaf cells having a threshold coupling to the leaf cell.

15. The machine-readable medium of claim 13, wherein instructions to store data corresponding to the neighborhood of the leaf cell include storing the coupling resistance, coupling capacitance, coupling inductance, or combinations thereof for the leaf cell.

16. The machine-readable medium of claim 13, wherein instructions to store data corresponding to the neighborhood of the leaf cell include storing distances to the one or more conductors that contribute at or above the threshold level to the coupling parameters.

17. The machine-readable medium of claim 13, wherein instructions to build a neighborhood of the leaf cell includes determining a geometry of the conductors that contribute at or above the threshold level to the coupling parameters.

18. The machine-readable medium of claim 13, wherein the instructions include instructions to:
    access the hierarchical description of the chip layout;
    access a description of chip layers, the description including a thickness of each chip layer and distances between the chip layers; and
    access a description of dielectric constants for chip layers that are non-conducting.

19. The machine-readable medium of claim 13, wherein the instructions include instructions to:
    identify another leaf cell having an environment matching the built neighborhood, the other leaf cell being in the hierarchical description of the chip layout;
    apply the stored data corresponding to the built neighborhood to generate a neighborhood for the other leaf cell; and
    store information of the generated neighborhood of the other leaf cell.

20. The machine-readable medium of claim 13, wherein the instructions include instructions to:
    traverse from a leaf cell level to a top level of the hierarchical description of the chip layout;
    perform a three-dimensional Monte Carlo random-walk process, coupling parameter calculation, and neighborhood build at each level traversed; and
    output extracted coupling parameters, the extracted coupling parameters including one more of coupling resistance, coupling capacitance, coupling inductance, or combinations thereof at each level traversed.

21. The machine-readable medium of claim 13, wherein the instructions include instructions to repeat the three-dimensional Monte Carlo random-walk process from the leaf cell, the generated of information, the filtering of the information, and the building of the neighborhood, if a value for a coupling parameter does not meet an accuracy threshold level.

22. A system comprising:
    a controller; and
    a machine-readable medium having instructions executable by the controller such that, when executed, cause the controller to direct a process to:
        identify a leaf cell in a hierarchical description of a chip layout;
        apply a three-dimensional Monte Carlo random-walk process from the leaf cell;
        generate information from the three-dimensional Monte Carlo random-walk process, the generation of information including the calculation or one or more coupling parameters, the one or more coupling parameters including coupling resistance, coupling capacitance, coupling inductance, or combinations thereof;
        filter the information to determine one or more conductors that contribute at or above a threshold level to the coupling parameters and neglect conductors that contribute below the threshold level to the coupling parameters, the threshold level being a numeric threshold level;
        build a neighborhood of the leaf cell, the neighborhood including the conductors that contribute at or above the threshold level to the coupling parameters and neglecting the conductors that contribute below the threshold level to the coupling parameters; and
        store data corresponding to the neighborhood of the leaf cell.

23. The system of claim 22, wherein instructions to store data corresponding to the neighborhood of the leaf cell include storage of the coupling resistance, coupling capacitance, coupling inductance, or combinations thereof for the leaf cell.

24. The system of claim 22, wherein instructions to store data corresponding to the neighborhood of the leaf cell include storage of distances to the one or more conductors that contribute at or above the threshold level to the coupling parameters.

25. The system of claim 22, wherein instructions to build a neighborhood of the leaf cell includes determination of a geometry of the conductors that contribute at or above the threshold level to the coupling parameters.

26. The system of claim 22, wherein the instructions include instructions to:
    identify another leaf cell having an environment matching the built neighborhood, the other leaf cell being in the hierarchical description of the chip layout;
    apply the stored data corresponding to the built neighborhood to generate a neighborhood for the other leaf cell; and store information of the generated neighborhood of the other leaf cell.

27. The system of claim 22, wherein the instructions include instructions to:
- traverse from a leaf cell level to a top level of the hierarchical description of the chip layout perform a three-dimensional Monte Carlo random-walk process, coupling parameter calculation, and neighborhood build at each level traversed; and
- output extracted coupling parameters, the extracted coupling parameters including one more of coupling resistance, coupling capacitance, coupling inductance, or combinations thereof at each level traversed.

28. The system of claim 22, wherein the instructions include instructions to repeat the three-dimensional Monte Carlo random-walk process from the leaf cell, to repeat the generated of information, to repeat the filtering of the information, to repeat the building of the neighborhood, and to repeat the storing of data, if a value for a coupling parameter does not meet an accuracy threshold level.

29. The system of 22, wherein the controller includes a processor.

30. The system of claim 22, wherein the system includes a display to exhibit a representation correlated to the stored data.

\* \* \* \* \*